United States Patent [19]

Anderson

[11] Patent Number: 4,538,106
[45] Date of Patent: Aug. 27, 1985

[54] OUTPUT TRANSISTOR DRIVER DIAGNOSTIC SYSTEM

[75] Inventor: Robert L. Anderson, Saline, Mich.

[73] Assignee: Ford Motor Company, Dearborn, Mich.

[21] Appl. No.: 503,924

[22] Filed: Jun. 13, 1983

[51] Int. Cl.³ .................. G01R 31/26; G08B 21/00
[52] U.S. Cl. .................. 324/158 T; 340/635
[58] Field of Search .................. 324/158 T; 340/635, 340/644, 645, 514; 361/1, 91, 92

[56] References Cited

U.S. PATENT DOCUMENTS

| 2,764,753 | 9/1956 | Martin | 340/635 |
| 3,527,987 | 9/1970 | Havlicek | 361/1 |
| 3,824,390 | 7/1974 | Magyar | 340/635 |

FOREIGN PATENT DOCUMENTS 507887 3/1976 U.S.S.R. .................. 340/635

Primary Examiner—Ernest F. Karlsen
Attorney, Agent, or Firm—Peter Abolins; Robert D. Sanborn

[57] ABSTRACT

An apparatus for diagnosing the operation of a plurality of output transistor drivers includes a plurality of detection transistors, a reference resistor and a voltage detector. Each detection resistor is coupled from a collector of one output transistor driver to a common node. The reference resistor is coupled between the common node and a ground potential. The voltage detector measures voltage across the reference resistor to determine the existence of an improperly functioning transistor. The test method includes turning off all the transistor drivers, detecting the voltage, and comparing the voltage to a reference voltage to determine if any transistors are shorted. If there are no shorts, the transistors are sequentially turned on to determine if any transistors are open.

2 Claims, 3 Drawing Figures

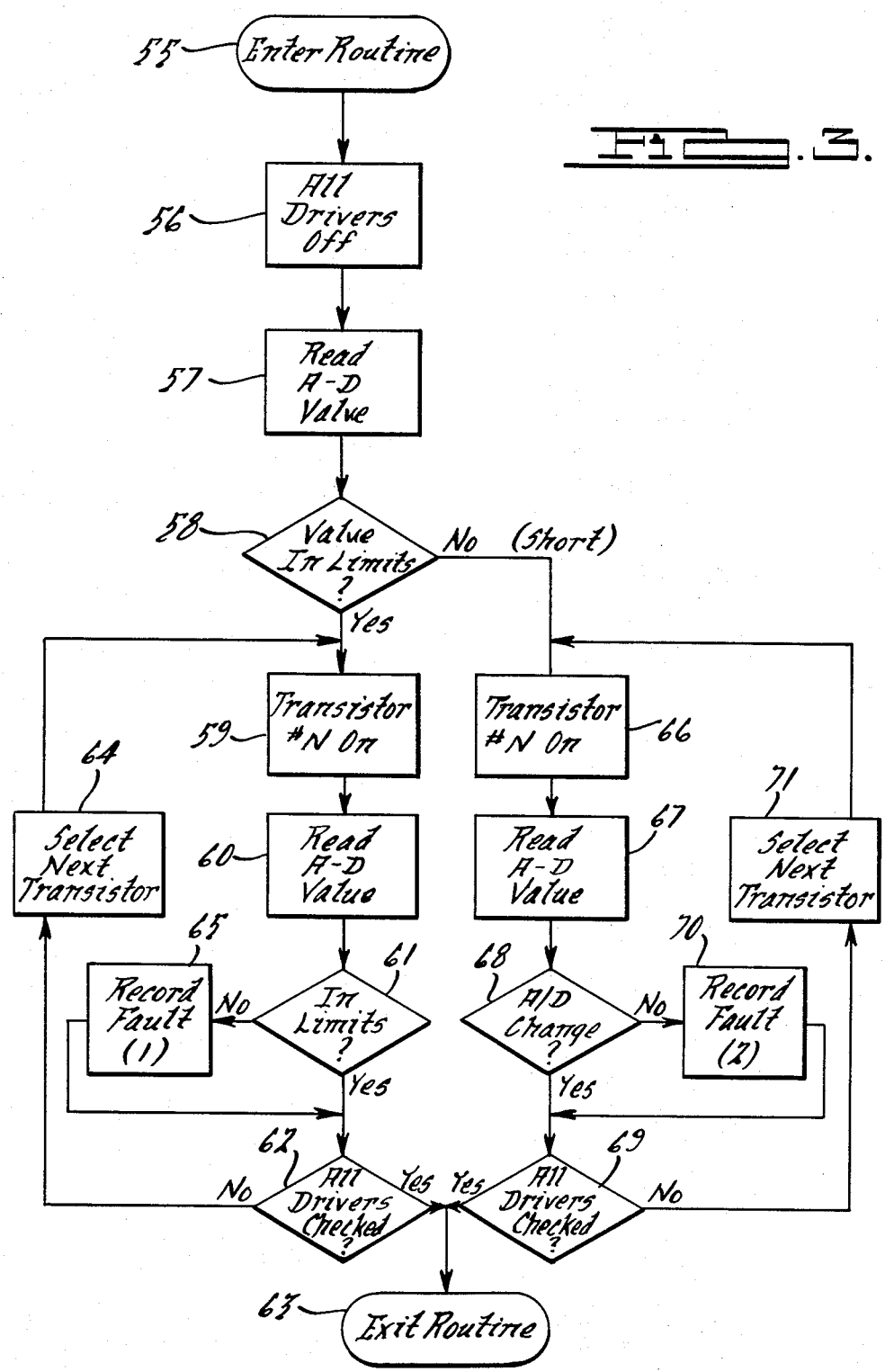

OUTPUT TRANSISTOR DRIVER DIAGNOSTIC SYSTEM

BACKGROUND OF THE INVENTION

1. Field of the Invention

This invention relates to diagnostic systems for transistor circuits.

2. Prior Art

There are known ways to detect the failure of a transistor driving an output load. For example, the circuit containing the transistor can be removed from all other circuitry and an ohm meter placed across the current path between the collector and the emitter leads to determine if the transistor is shorted. Disconnection or removal of the circuit containing the transistor can be relatively inconvenient. For example, if the transistor circuit is part of an automotive electronic engine control system, removal or disconnection of the circuit from the automobile may take an undesirable amount of time or add to the cost of any necessary repair.

Further, an additional piece of test equipment, such as an ohm meter, is necessary. An operator for the test equipment is also necessary and there may be required an interpretation of the results. The interpretation may require judgment which may lead to inconsistent diagnoses in different cases. These are some of the problems this invention overcomes.

SUMMARY OF THE INVENTION

An apparatus and a method for diagnosing the operation of a plurality of output transistor drivers includes a plurality of detection resistors, a reference resistor, and a voltage detector. The plurality of detection resistors are coupled from a collector of one output driver transistor to a common node. The reference resistor is coupled between the common node and a ground potential. The voltage detector is coupled between the common node and the ground potential for measuring voltage to determine the existence of an improperly functioning transistor.

BRIEF DESCRIPTION OF THE DRAWINGS

FIG. 3 is a logic flow diagram of a test sequence using the apparatus of FIG. 2 in accordance with an embodiment of this invention.

DETAILED DESCRIPTION OF THE INVENTION

Figure 1:
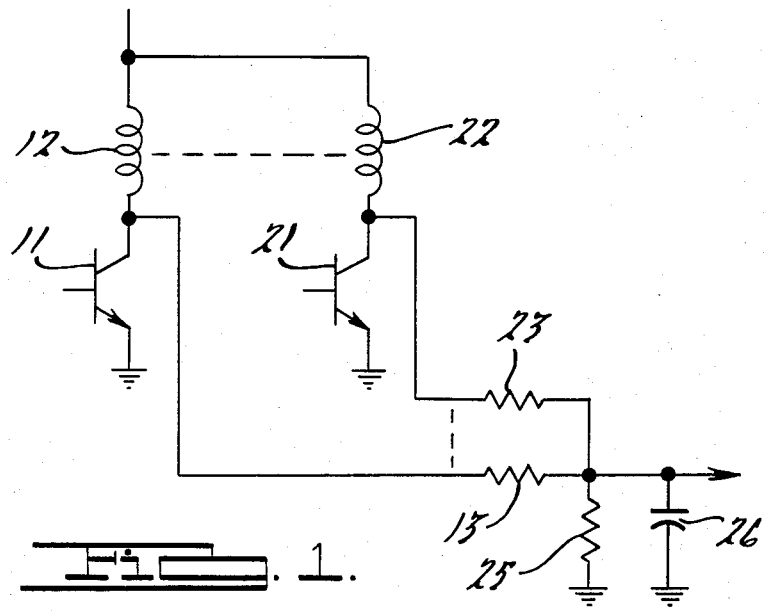
FIG. 1 is a schematic diagram of a resistance arrangement coupled to an output driver transistor in accordance with an embodiment of this invention.

Referring to FIG. 1, a transistor 11 has a load coil 12 coupled to the collector and a ground reference potential coupled to the emitter. Similarly, a transistor 21 has a load coil 22 coupled to the collector of transistor 21 and a ground reference potential coupled to the emitter of transistor 21. A detector resistor 13 is coupled to the collector of transistor 11 and a detector resistor 23 is coupled to the collector of transistor 21. A reference resistor 25 is coupled between ground and a common node of resistors 13 and 23. A capacitor 26, to suppress noise, is coupled in parallel with resistor 25. The voltage across resistor 25 is monitored as transistors 11 and 21 are selectively activated to determine if either of the transistors is shorted.

Figure 2:
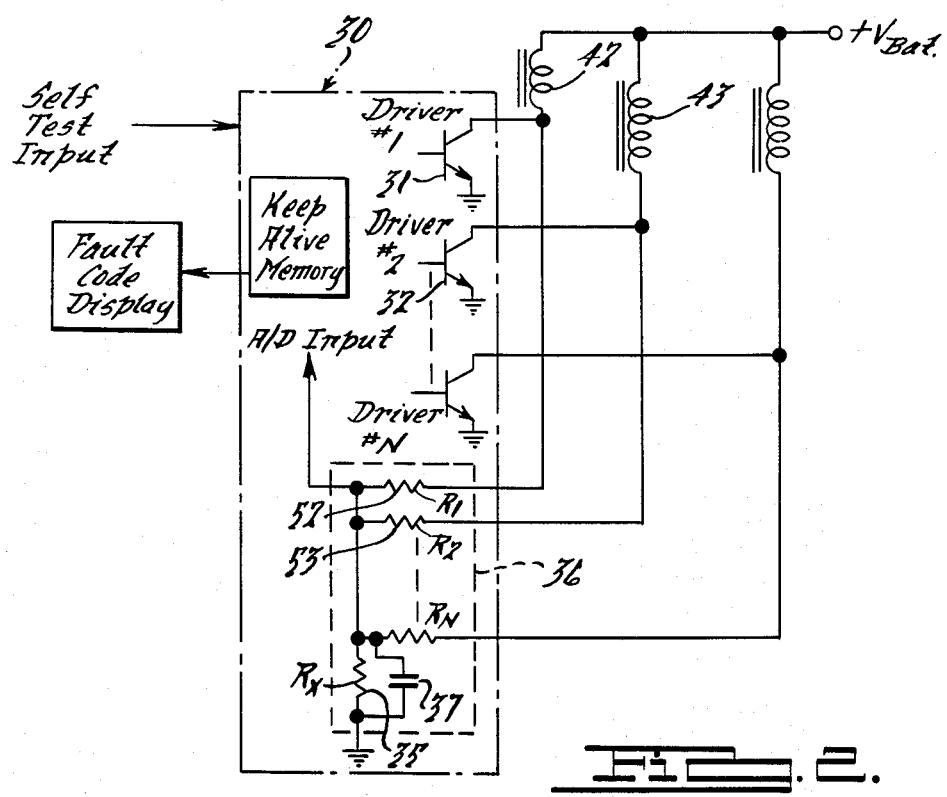
FIG. 2 is a schematic of a self-diagnostic testing connection for use with an electronic engine control in accordance with an embodiment of this invention.

Referring to FIG. 2, an electronic engine control unit 30 has a plurality of driving transistors 31, 32, to N. Each of the transistors 31, 32 has a collector coupled to a coil 42, 43, respectively, and a detection resistor 52, 53, respectively. Resistors 52 and 53 are coupled to a common node. A reference resistor 35 is coupled between the common node and a ground reference potential. Such circuitry in accordance with an embodiment of this invention has been designated within a dotted box 36. An analog to digital input is coupled to the node between resistor 35 and resistors 52 and 53. A capacitor 37 is connected in parallel with resistor 35 and helps to suppress unwanted electrical noise. Electronic engine control module 30 receives a self-test input and provides an output to display a fault code.

Referring to FIG. 3, a flow chart for operating a diagnostic circuit such as illustrated in FIG. 2 includes beginning the routine at a block 55, turning off all the driving transistors at a block 56, and reading the analog to digital voltage value at a block 57. Block 58 determines whether the analog to digital voltage value is within limits. If the value is within limits, indicating none of the driver transistors is shorted, the routine goes to a block 59 wherein the first transistor is turned on. Then, at a block 60, the analog to digital voltage value is read again. At block 61, there is again a determination to see if the analog to digital value is within limits. If the value is within limits, the routine proceeds to a block 62 wherein it is determined if all the transistor drivers have been checked. If the answer is yes, the program exits to a block 63. If the answer is no, the program selects the next transistor at a block 64 and returns to execute block 59 again. If the determination in block 61 is that the analog to digital voltage value is not within limits, the routine goes to a block 65 which records the fault as indicating that the transistor or coil is open. From block 65, the routine proceeds to block 62 wherein it is asked if all the drivers have been checked.

Returning to block 58, wherein the initial analog to digital voltage value is checked to see if it is within limits, if the answer is no, indicating a shorted driving transistor, the routine proceeds to a block 66 wherein the first transistor is turned on. From block 66 the routine goes to block 67 wherein the analog to digital voltage value is read. Next, at a block 68, it is asked whether the analog to digital voltage value has changed. If the answer is yes, the program goes to a block 69 wherein it is asked if all the drivers have been checked. If the answer is no, the program goes to a block 70 which records a fault such as a shorted transistor and then goes on to block 69. If the answer in block 69 is that all of the drivers have been checked, the routine goes to a block 63. If the answer in block 69 is that all of the drivers have not been checked, the program goes to a block 71 which selects the next transistor to check and returns to the input of block 66.

In accordance with this invention, an engine control module can self-check its output driver transistors to identify either a normal, shorted or open transistor. It may also be possible to detect an open solenoid coil. The circuitry shown in FIG. 2 can be used to check a plurality of individual output drivers. A typical number of drivers which can be checked is about 8 to 12.

In operation, electronic engine control module 10 can perform a self-test mode program in accordance with the logic flow diagram of FIG. 3. The test routine includes turning off all the transistor drivers and reading the analog to digital input value of the microprocessor and comparing it to expected limits. If the voltage is lower than expected, it indicates at least one of the output drivers is short circuited. As a result of this test, the program branches into one of two paths. If the first reading is within limits, i.e. no shorts, then testing proceeds to determine if any transistors are open. This is accomplished by sequentially turning each transistor driver on, one at a time, and rechecking the analog to digital input channels for a lower value. Each transistor driver is turned off sequentially so that only one transistor driver is on at a time. If the reading is within the expected limits, it indicates the transistor is not open and is operating normally. If the analog to digital reading is unchanged from the reading obtained when all the transistor drivers are turned off, this indicates the transistor driver did not turn on and is therefore opened. If the initial analog to digital input channel reading is lower, but the change in voltage is small, on the order of 40–50 millivolts, it indicates an open solenoid. This specific fault is identified based on voltage changes and is displayed for the service technician. This process continues until all output transistor drivers have been checked before exiting that portion of the test program.

If, after the initial test, a shorted transistor is detected, another routine is used to determine the transistor or transistors that are shorted. Again, a drive signal is placed on the base of each driver transistor, one at a time, and the analog to digital input channel value is read. If no change is detected when a particular transistor driver is turned on, it means that that the particular transistor driver must already be on and be shorted. When the shorted transistor driver is detected, that fault is identified and displayed for the service technician. Typically, the display issues a code number which identifies the specific defective transistor driver and the fault, such as being open or shorted.

The expected A/D input voltage levels for the normal case (good transistor drivers, normal solenoids) and each of the fault conditions can be predetermined by formulas involving the circuit resistances, battery voltage, and saturation voltage of the transistor drivers. These formulas are given below, for each of the expected conditions. Also, a specific calculated result is shown as an example assuming the following circuit values:

VBAT = 12.6 volts (battery voltage)
VSAT = 0.6 volts (collector to emitter voltage at saturation of a driver transistor)
$Rx = 3 \times 10^3$ ohms (reference resistor value)
$Rs = 10^5$ ohms (detection resistor value)
N = 10 (number of transistor drivers)

If all transistors are off, and none are shorted, the expected A/D input voltage is given by the formula:

$$V_{AD} = \frac{Rx\,(VBAT)}{Rx + Rs/N} = \frac{3\,(12.6)}{3 + 100/10} = 2.953V$$

As transistors are turned on, one at a time, a normal transistor will cause an A/D voltage change ($\Delta V$) of:

$$\Delta V = \frac{Rx\,(VBAT - VSAT)}{Rs + N \cdot Rx} = \frac{3\,(12.6 - 6)}{100 + 3\,(10)} = 0.2769V$$

An open transistor will produce no change ($\Delta V = 0$). If one transistor is shorted, the initial A/D reading will be lower than the expected reading of 2.953 V:

$$V_{AD} = \frac{Rx \cdot VBAT \cdot (N-1) + V_{sat}}{Rs + Rx \cdot (N)} = \frac{3\,(12.6)\,(9) + .6}{100 + 3\,(10)} = 2.630V$$

The change in the A/D reading, when the good transistors are energized is still:

$$\Delta V = \frac{Rx\,(VBAT - VSAT)}{Rs + N \cdot Rs} = \frac{3\,(12.6 - 6)}{100 + 3\,(10)} = 0.2769V$$

However, the $\Delta V$ for the shorted transistor will be $\Delta V = 0$.

If a solenoid is open circuit, the A/D value for the initial "all off" test will be lower, and the $\Delta V$ will be different for the good driver transistor, normal solenoid condition versus the good driver transistor, open solenoid:

Open Solenoid, All Driver Transistors Off:

$$V_{AD} = \frac{VBAT \cdot Rx}{Rx + Rs/N - 1} = \frac{12.6\,(3)}{3 + 100/9} = 2.678V$$

Good Solenoid, Good Driver Transistor On:

$$V = \frac{3\,(VBAT - VSAT)}{100 + 3\,(N-1)} = \frac{3\,(12.6 - .6)}{100 + 27} = .2834V$$

Open Solenoid, Good Driver Transistor On:

$$\Delta V = \frac{9(N-1)\,(VBAT - VSAT) - 300\,(VSAT)}{3\,(N-1) + 100\,\,3 \cdot N + 100}$$

$$\Delta V = \frac{9.9\,(12.6 - .6) - 300\,(.6)}{(3\,(9) + 100)\,(30 + 100)} = .0479V$$

Thus, if the initial test (all transistor drivers off) indicates there are no shorted transistor drivers, $\Delta V$ of 0.2796 V indicates a normal transistor, a $\Delta V$ of zero indicates an open transistor, and a $\Delta V$ of 0.0479 indicates a good transistor, but an open solenoid coil.

Various modifications and variations will no doubt occur to those skilled in the arts to which this invention pertains. For example, the particular magnitudes of resistors and voltages may be varied from that disclosed herein. These and all other variations which basically rely on the teachings through which this disclosure has advanced the art are properly considered within the scope of this invention.

I claim:

1. An apparatus for diagnosing the operation of a plurality of output transistor drivers of an electronic engine control module including:
    a plurality of detection resistors, each detection resistor having a magnitude of about 100,000 ohms and being coupled from a collector of one output transistor driver to a common node;
    a reference resistor, having a magnitude of about 3000 ohms, coupled between said common node and a ground potential; and
    a voltage detector coupled to said common node for measuring voltage to determine whether the voltage is within predetermined limits and thereby to determine the existence of an improperly functioning transistor driver.

2. A method of diagnosing the functioning of a plurality of output transistor drivers of an electronic engine control module including:

connecting a resistor from each collector of each output transistor driver to a common node;
connecting a reference resistor from the common node to a ground potential;
turning off of the output transistor drivers;
measuring a first diagnostic voltage at the common node;
comparing said first diagnostic voltage to an expected voltage value;
concluding at least one output transistor driver is shorted if the measured first diagnostic voltage is outside a first expected voltage value limit;
sequentially turning on each transistor driver;
measuring a second diagnostic voltage at the common node;
comparing said second diagnostic voltage to said first diagnostic voltage;
concluding a turned on transistor is open if said second diagnostic voltage is equal to said first diagnostic voltage;
concluding a turned on transistor is associated with an open load solenoid if said second diagnostic voltage is about 40 to 50 millivolts greater than said first diagnostic voltage; and
displaying the existence of a fault upon concluding there is an open transistor or a shorted transistor.

* * * * *